United States Patent
Ogasawara et al.

(10) Patent No.: US 7,005,323 B2
(45) Date of Patent: Feb. 28, 2006

(54) METHOD AND APPARATUS FOR SHIELDING INTEGRATED CIRCUITS

(75) Inventors: Hiroshi Ogasawara, Kanagawa (JP); Hideyuki Kurita, Kanagawa (JP)

(73) Assignee: RFStream Corporation, Osaka (JP)

(*) Notice: Subject to any disclaimer, the term of this patent is extended or adjusted under 35 U.S.C. 154(b) by 0 days.

(21) Appl. No.: 11/156,345

(22) Filed: Jun. 16, 2005

(65) Prior Publication Data

US 2005/0250246 A1    Nov. 10, 2005

Related U.S. Application Data

(62) Division of application No. 10/191,983, filed on Jul. 8, 2002.

(60) Provisional application No. 60/325,327, filed on Sep. 27, 2001.

(51) Int. Cl.
*H01L 21/48* (2006.01)
*H01L 21/50* (2006.01)

(52) U.S. Cl. ..................... 438/108; 438/127
(58) Field of Classification Search ............... 438/106, 438/108, 127
See application file for complete search history.

(56) References Cited

U.S. PATENT DOCUMENTS

| 4,861,941 | A | | 8/1989 | Kubo et al. |
| 5,218,234 | A | | 6/1993 | Thompson et al. |
| 5,371,404 | A | * | 12/1994 | Juskey et al. ............... 257/659 |
| 5,656,857 | A | | 8/1997 | Kishita |
| 5,801,521 | A | | 9/1998 | Mizoguchi et al. |
| 5,991,162 | A | | 11/1999 | Saso |
| 6,723,627 | B1 | | 4/2004 | Kariyazaki et al. |
| 2003/0067349 | A1 | | 4/2003 | Muramatsu |

FOREIGN PATENT DOCUMENTS

JP          2003124029 A       4/2003

* cited by examiner

Primary Examiner—Scott Geyer
(74) Attorney, Agent, or Firm—Stattler, Johansen & Adeli, LLP

(57) ABSTRACT

Some embodiments of the invention cover the top of a flip chip IC with a conductive adhesive material. This material is used in place of a shielding metal can or plate in some embodiments, while it is used in conjunction with such metal can or plate in other embodiments of the invention. Also, some embodiments use a printing technique to coat the top of the flip chip with the conductive adhesive material. In some embodiments, the coating material is a silver paste.

13 Claims, 2 Drawing Sheets

METHOD AND APPARATUS FOR SHIELDING INTEGRATED CIRCUITS

CROSS-REFERENCE TO RELATED APPLICATIONS

This patent application is a divisional patent application of U.S. patent application Ser. No. 10/191,983, filed on Jul. 8, 2002, and entitled "METHODS AND APPARATUS FOR SHIELDING INTEGRATED CIRCUITS," which claimed priority to an earlier filed U.S. Provisional Patent Application Ser. No. 60/325,327, filed on Sep. 27, 2001.

FIELD OF THE INVENTION

The present invention is directed towards method and apparatus for shielding integrated circuits.

BACKGROUND OF THE INVENTION

To date, several techniques have been used for shielding integrated circuits ("IC's"). These techniques typically use metal cans or metal plates. Such techniques have a number of disadvantages. For instance, shielding metal cans and plates often prevent dense mounting of IC's on printed circuit boards ("PCB's"). Also, prior art shielding techniques hinder the development of IC's that have both digital and analog sections, because they do not adequately attenuate radiation between the digital and analog sections of such IC's. In addition, high frequency IC's generate considerable heat that needs to be dissipated. Prior techniques use heat sinks and fans for this task. However, such heat sinks and fans are often bulky.

SUMMARY OF THE INVENTION

Some embodiments of the invention cover the top of a flip chip IC with a conductive adhesive material. This material is used in place of a shielding metal can or plate in some embodiments, while it is used in conjunction with such metal can or plate in other embodiments of the invention. Also, some embodiments use a printing technique to coat the top of the flip chip with the conductive adhesive material. In some embodiments, the coating material is a silver paste.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

The present invention is directed towards method and apparatus for shielding integrated circuits. In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 1:
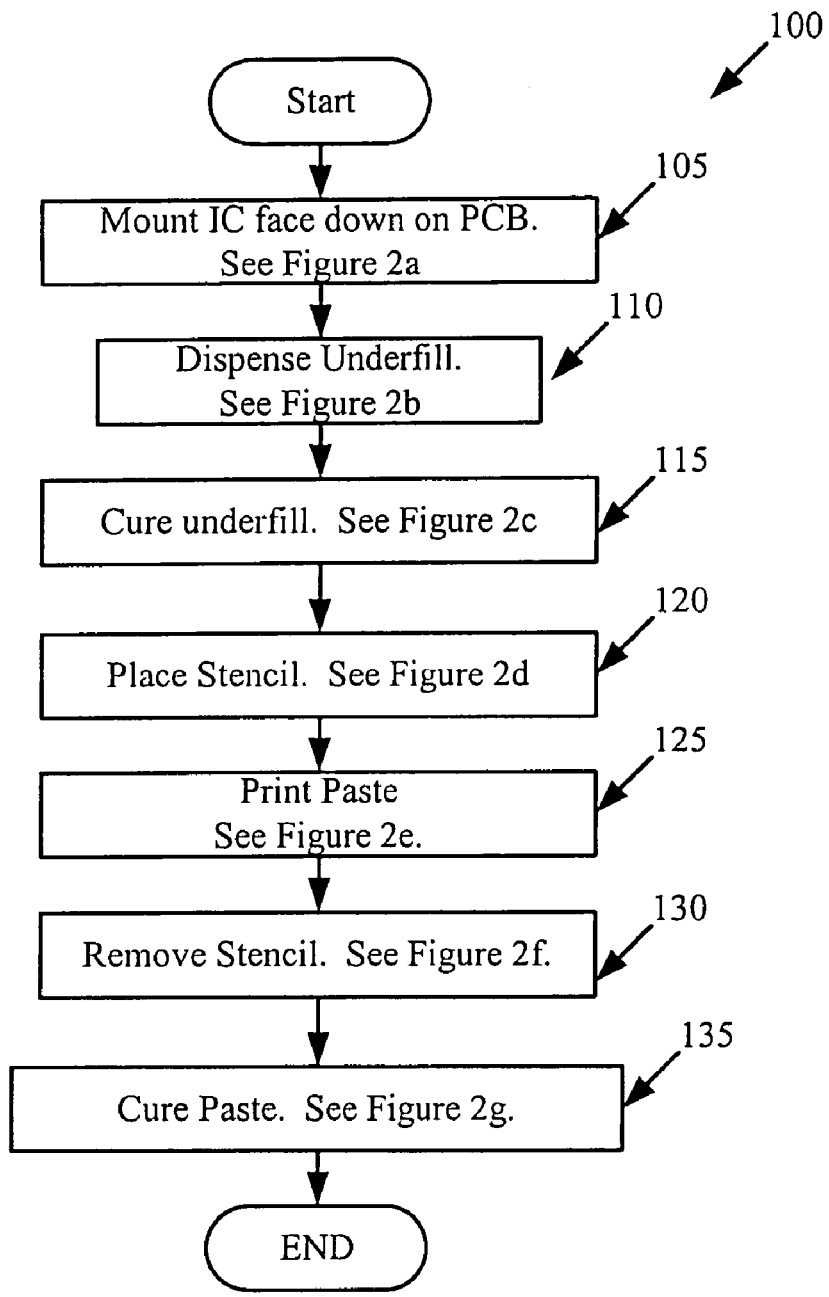
FIG. 1 illustrates a process for shielding a flip-chip IC according to one embodiment of the invention.

FIG. 1 illustrates a process 100 for packing a flip-chip IC according to one embodiment of the invention. This process starts (at 105) by mounting a flip-chip IC ("flip chip") on a PCB. A flip chip is a semiconductor die that on one side has all its terminations, which can be in a variety of forms such as solder pads, bumps, or balls. Such a chip is typically connected to other circuits by flipping it over and mounting the chip on another substrate (e.g., a PCB) so that the chip's terminations abut electronic contacts on the other substrate (e.g., abut wiring leads on a PCB).

Figure 2A:
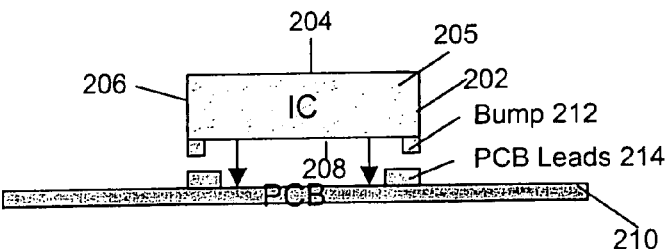
FIGS. 2a–2g illustrate the shielding of a flip-chip IC according to the process of FIG. 1.
Figure 2B:
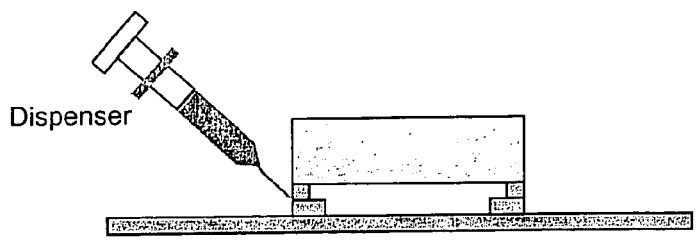

FIG. 2a illustrates a flip chip 205 that is mounted face down on a PCB 210. In the embodiment illustrated in FIGS. 2a–2g, this chip is a semiconductor die that has bump terminations 212, which are also called IC contacts below. As shown in FIG. 2b, these terminations make contact with contacts 214 on the PCB 210. In the embodiments illustrated in FIGS. 2a–2g, this semiconductor die 205 includes (1) a semiconductor substrate (e.g., a silicon substrate), (2) several electronic devices (e.g., transistors) that are built in the substrate, and (3) one or more interconnect (e.g., metal or polysilicon) layers for creating and connecting the devices. In FIGS. 2a–2g, the semiconductor substrate forms sides 202, 204, and 206 of the die, while the devices and interconnect layers are on the top side 208 of the die. In other words, the IC 205 is flipped over so that (1) its top side 208, which contains its devices, interconnect layers, and terminations 212, faces the PCB and (2) its terminations 212 abut the PCB contacts 214. Hence, the IC 205 is referred to as a "flip" chip.

Figure 2C:
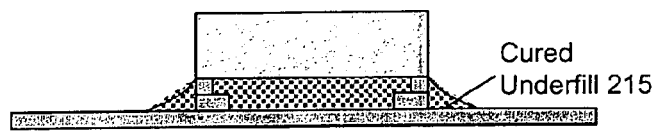

After mounting the flip chip, an underfill is dispensed (at 110) beneath the chip and is then cured (at 115). FIG. 2b illustrates the dispensing of the underfill, while FIG. 2c illustrates the cured underfill 215. The cured underfill is an adhesive that is used to attach the chip to the PCB. Some embodiments use an epoxy-based adhesive as the underfill, and cure this underfill by placing the PCB in an oven at 150° C. for 30 minutes. One of ordinary skill will realize that other embodiments might not use an underfill, might use different materials for the underfill, and/or might cure the underfill differently. As shown in FIG. 2c, the cured underfill covers the IC's top side 208 and covers each set of abutting IC and PCB contacts 212 and 214, in order to insulate the IC's top side and abutting contacts from the conductive adhesive paste that is later applied to the sides 202, 204 and 206 of the IC.

After curing the underfill, the mounted flip chip (referred to as "the mounted IC" in the remainder of the specification) is covered with a conductive adhesive paste. To coat the mounted IC, the embodiments described below use a particular silk-screen printing method. One of ordinary skill will realize, however, that other embodiments use other techniques for covering the mounted IC with the conductive adhesive paste. For instance, some embodiments might use a potting approaching, e.g., an approach that uses a dispenser to place (squeeze) the paste over the target chip.

Figure 2D:
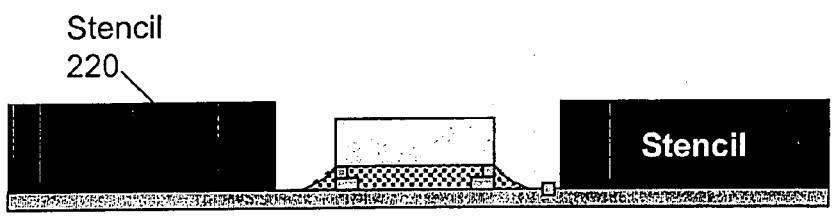
Figure 2E:
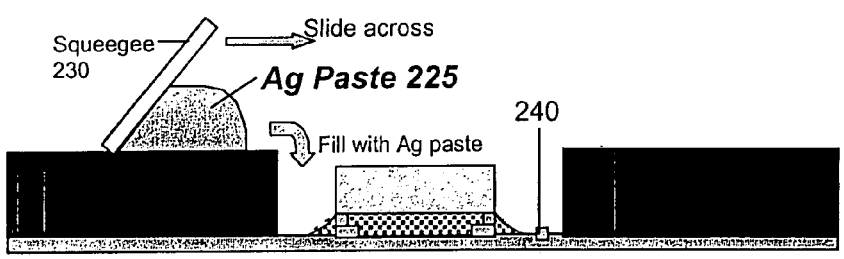
Figure 2F:
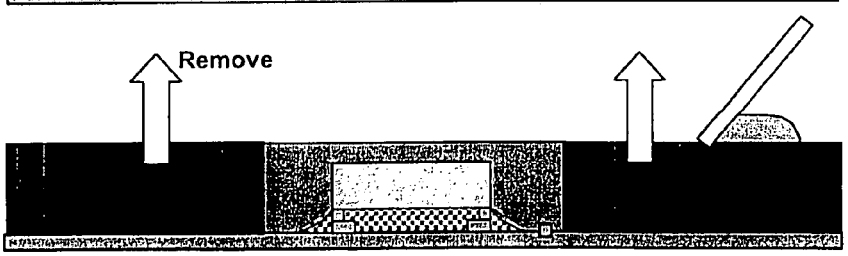

According to the silk-screen printing method, a stencil is placed (at 120) about the mounted IC. As shown in FIG. 2d, the stencil 220 surrounds the mounted IC in some embodiments of the invention. The conductive adhesive paste is then printed (at 125) on top of the mounted IC. As shown in FIG. 2e, this paste is printed on by depositing the paste 225 on top of the placed stencil and smearing the paste evenly across the stencil (e.g. by sliding a squeegee 230 across the top of the stencil). Using this approach, the paste fills in the empty space between the stencil and the mounted IC, as shown in FIGS. 2e and 2f. This paste covers sides 202, 204, and 206 of the IC 205, as shown in FIG. 2f.

Different embodiments of the invention use different types of paste. Examples of pastes used by some embodiments include silver (Ag), copper (Cu), solder, or palladium (Pd). The embodiments illustrated in FIGS. 2a–2g use a silver paste. This silver paste dissipates heat from the IC. Also, when grounded, this paste strongly attenuates radiating signals.

In some embodiments, the silver paste is selected by striking a balance among the following considerations: (1) conductivity of the paste, (2) silver content, (3) cost, (4) viscosity, (5) application thickness or volume, (6) accuracy and efficiency of the application, and (7) application method.

Some embodiments try to select the resistivity of the paste to be as low as possible. The silver paste is an epoxy-based adhesive that contains a certain percentage silver particles. Silver paste vendors provide the paste in varying levels of silver content. The more silver the better because that would increase the conductivity. However, the additional silver content will increase the cost, and hence there needs to be a balance between conductivity and cost.

Another factor that needs to be considered is the viscosity of the paste. Some embodiments try to select a thicker paste because it lowers the resistance. Of course, the thicker the layer, the more material is used, which, in turn, increases the cost. The thickness of the paste also affects the application of the paste. Generally, a paste needs to be thick enough so it does not spread out of the desired area before curing, but thin enough so it is easy to apply. Some embodiments use the silk-screen printing application because it allows the use of thicker paste. Viscosity, or thickness, of the paste can be adjusted by the epoxy resin, but if all else is equal, higher silver content results in thicker paste.

Figure 2G:
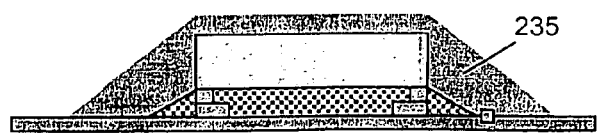

At 130, the stencil is removed. FIG. 2f illustrates this removal. As shown in FIG. 2f, the paste that hangs over the side of the IC touches a grounding contact 240 on the PCB. As mentioned above, this ground allows the paste to attenuate strongly radiating signals. At 135, the paste is then cured. In some embodiments that use a silver paste, the paste is cured at high temperature. For instance, in some embodiments, the paste is heated at 150° C. for 30 minutes. FIG. 2g illustrates the IC 205 mounted on the PCB 210 and covered on its sides 202, 204, and 206 with cured silver paste 235. The paste directly contacts the sides 202, 204, and 206 of the IC. Some embodiments do not use any other shielding metal can or plate to cover the IC illustrated in FIG. 2g. Other embodiments, however, still cover this IC with a shielding can or plate.

One of ordinary skill will realize that shielding an IC according to the process 100 of FIG. 1 has numerous advantages. First, it minimized the mounting space used by the IC on a PCB. Second, it effectively shields the IC circuit components from noise interference from outside the IC. Third, it effectively attenuates radiation noise from the IC components to electronic components outside of the IC. Fourth, this shielding approach provides an inexpensive way of dissipating heat in high-frequency IC's.

Fifth, for IC's that have both digital and analog components, it greatly attenuates radiation between the digital and analog sections of such IC's. Specifically, such radiation rapidly decays as it propagates through the silver paste. This rapid propagation decay allows digital and analog components to operate on the same IC.

While the invention has been described with reference to numerous specific details, one of ordinary skill in the art will recognize that the invention can be embodied in other specific forms without departing from the spirit of the invention. For instance, the embodiments described above cover one flip chip with a low impedance material. Other embodiment might mounted several flip chips onto a substrate, and then cover all the mounted chips with a low impedance material. Thus, one of ordinary skill in the art would understand that the invention is not to be limited by the foregoing illustrative details.

We claim:

1. A method of shielding an integrated circuit ("IC"), the IC having a plurality of sides, the method comprising:
   a) along a first side of the IC, mounting the IC on a substrate; and
   b) printing a low impedance material on the IC using a stencil to cover each side of the plurality of sides of the IC, except the first side, with the low impedance material.

2. The method of claim 1, wherein the low impedance material is a conductive material.

3. The method of claim 1, further comprising curing the low impedance material.

4. The method of claim 3, wherein the first side of the IC includes a plurality of electrical contacts that abut a plurality of contacts on the substrate, wherein the method further comprises dispensing an underfill material on the substrate and below the IC, wherein the underfill material insulates the first side of the IC and the contacts from the low impedance material.

5. The method according to claim 4, further comprising curing the underfill material.

6. The method of claim 3, wherein the material includes copper.

7. The method of claim 1, wherein the material includes silver.

8. The method of claim 7, wherein the material is a silver paste.

9. The method of claim 1, wherein the IC is a flip-chip IC.

10. A method of shielding an integrated circuit ("IC"), the IC having a plurality of sides, the method comprising:
    a) along a first side of the IC, mounting the IC on a substrate; and
    b) printing a low impedance material on the IC using a stencil to cover at least two sides of the plurality of sides, but not the first side, with a low impedance material.

11. The method of claim 10, wherein the first side of the IC further comprises each termination of the IC, wherein the method further comprises dispensing underfill material between the first side of the IC and the substrate, the underfill material insulating each termination of the IC on the first side from the low impedance material.

12. The method of claim 10, wherein the low impedance material is a conductive material.

13. The method according to claim 10, further comprising curing the underfill material.

* * * * *